United States Patent
Ranta

(10) Patent No.: US 7,586,384 B2
(45) Date of Patent: Sep. 8, 2009

(54) INTEGRATED LOAD IMPEDANCE SENSING FOR TUNABLE MATCHING NETWORKS

(75) Inventor: Tero Ranta, Turku (FI)

(73) Assignee: Nokia Corporation, Espoo (FI)

( * ) Notice: Subject to any disclaimer, the term of this patent is extended or adjusted under 35 U.S.C. 154(b) by 374 days.

(21) Appl. No.: 11/204,770

(22) Filed: Aug. 15, 2005

(65) Prior Publication Data
US 2007/0035356 A1 Feb. 15, 2007

(51) Int. Cl.
*H03H 7/38* (2006.01)
(52) U.S. Cl. .................... 333/17.3; 333/32
(58) Field of Classification Search ............. 333/17.3, 333/32
See application file for complete search history.

(56) References Cited
U.S. PATENT DOCUMENTS
6,414,562 B1 7/2002 Bouisse et al.

2003/0184319 A1 10/2003 Nishimori et al.

FOREIGN PATENT DOCUMENTS
EP 1 298 810 4/2003

OTHER PUBLICATIONS
Dongjiang Qiao. et al "Antenna Impedance Mismatch Measurement and Correction for Adaptive CDMA Transceivers", Microwave Symposium Digest, 2005 IEEE MTT-S International, Jun. 12-17, 2005.

*Primary Examiner*—Stephen E Jones

(57) ABSTRACT

An impedance matching system may be used, for example, for impedance matching between a transmitter/receiver front-end and an antenna in a mobile communication device. In a tuneable impedance matching system according to the invention a tuneable impedance matching circuit (508) is used also as a measuring circuit for obtaining a value of a load impedance. A real part and an imaginary part of a load impedance (503) is calculated based on voltages measured on nodes of the tuneable impedance matching circuit and on known component values of the tuneable impedance matching circuit. Values for adjustable electrical components (504, 505) of the tuneable impedance matching circuit are determined based on the obtained load impedance value and on an impedance matching condition.

15 Claims, 6 Drawing Sheets

INTEGRATED LOAD IMPEDANCE SENSING FOR TUNABLE MATCHING NETWORKS

FIELD OF THE INVENTION

The invention relates to tuneable impedance matching systems. An impedance matching system according to the invention may be used, for example, for impedance matching between a transmitter/receiver front-end and an antenna in a mobile communication device.

BACKGROUND OF THE INVENTION

In an electrical system maximum power transfer between a load and a source is achieved when impedances of the load and the source are matched with respect to each other, which minimizes reflection losses between the load and the source. For example, in a mobile communication device a characteristic impedance of a transmitter/receiver front-end is substantially constant but an antenna impedance varies considerably with frequency and with external circumstances. An example of an external circumstance that has an effect on the antenna impedance is positions of user's fingers in the vicinity of an antenna, i.e. an 'finger effect'. In a mobile communication device an antenna impedance can vary over a wide range, characterized by a voltage standing wave ratio (VSWR) reaching up to 10:1. For a receiver, non-optimal source impedance degrades a noise figure and a dynamic range. For a power amplifier of a transmitter, impedance mismatch has an adverse impact on power losses, maximum reachable output power, and linearity. Impedance mismatch may also change frequency responses of duplexer filters, as high-quality-value (high-Q) filters are very sensitive to changes in their load and supply impedances. Because of the abovementioned reasons, there is a need for a tuneable impedance matching system between a source and a load.

DESCRIPTION OF THE PRIOR ART

FIG. 1 shows a tuneable impedance matching system according to prior art in an exemplary application environment. The arrangement shown in FIG. 1 has a transmitter/receiver front-end 111, a tuneable impedance matching system 110, and an antenna 101. The transmitter/receiver front-end 111 has a transmitter (TX) power amplifier 102, a receiver (RX) amplifier 103, and a duplexer filter 104. The tuneable impedance matching system has a measuring circuit 105, an impedance matching circuit 106, and a controller 107. The measuring circuit 105 measures an antenna impedance, i.e. the impedance seen between a node 108 and a signal ground towards the antenna 101. During the measurement the impedance matching circuit 106 has to be either bypassed or its effect on a measured impedance value has to be compensated by post-processing when utilizing the measured impedance value. Based on the measured impedance value the controller 107, configures adjustable circuit components of the impedance matching circuit 106 to such positions that a desired impedance level is seen between a node 109 and signal ground towards the tuneable impedance matching system 110.

A tuneable impedance matching circuit consists of fixed and variable value inductors, capacitors, and/or transmission line sections. Variable value inductors and transmission line sections are typically realized as switched components so that electrical connection of a fixed value inductor or a transmission line section can be changed with the aid of one or more switches that can be e.g. FET-switches (Field Effect Transistor). Variable value capacitors can either be continuously variable (varicaps) or switched capacitors. For a practical impedance matching circuit with a wide matching range with practical component values a cascaded L-topology can be used. An example of the cascaded L-topology is shown in FIG. 2. An impedance Ztrx 201 represents the impedance of e.g. a transmitter/receiver front-end of a mobile communication device, an impedance Za 207 represents the impedance of e.g. an antenna of a mobile communication device, an ideal voltage source e_tx 202 represent e.g. voltage produced by a transmitter, and an ideal voltage source e_a 208 represents e.g. voltage induced to the antenna by incoming electromagnetic radiation. A tuneable impedance matching circuit 210 has two fixed value inductors 205 and 206, with inductances L1 and L2, and two adjustable capacitors 203 and 204, with capacitances C1 and C2. In the continuation we assume that the impedance Ztrx 201 is real valued. The values of the capacitors 203 and 204 are selected so that an impedance Z1 212 seen between a node 209 and a signal ground towards the impedance matching circuit 210 is as close to the value Ztrx of the impedance 201 as possible. Required capacitance values C1 and C2 for the capacitors 203 and 204 can be solved in a closed form:

$$C1 = \frac{\sqrt{\frac{1}{Ra}\left[D1 + D2\sqrt{D3}\right]}}{D4}, \quad (1)$$

and $$C2 = \frac{T1 + \sqrt{T2}}{T3}, \quad (2)$$

where:
D1=Ra $(\omega L1)^2$ +Ztrx $(\omega L2)^2$+$2\omega L2$ Xa Ztrx+Ra Ztrx$^2$+Xa$^2$ Ztrx+Ra$^2$Ztrx,
D2=2 Ztrx,
D3=Ra $((\omega L2)^2$ Ztrx+Ra$^2$ Ztrx+2 $\omega L2$ Xa Ztrx $-(\omega L1)^2$ Ra+Xa$^2$ Ztrx),
D4=Ztrx$\omega^2$ L1,
T1=$(\omega L2)^2$+$\omega^2$ L1 L2+2 $\omega L2$ Xa+$\omega L1$ Xa+Ra$^2$+Xa$^2$,
T2=$(\omega L2)^2$ Ra Ztrx+Ra$^3$ Ztrx+2 $\omega L2$ Xa Ra Ztrx $-(\omega L1)^2$ Ra$^2$+Xa$^2$ Ra$^2$,
T3=$\omega^2$ L1 $((\omega L2)^2$+Xa$^2$+Ra$^2$+$2\omega L2$ Xa), where ω is 2π×frequency at which the impedance matching is performed, and Ra and Xa are the real and imaginary parts of the impedance Za 207 at that frequency. When the values C1 and C2 obtained from equations (1) and (2) are given to capacitors 203 and 204 the impedance 212 seen between the node 209 and the signal ground towards the impedance matching circuit 210 has the same value as the impedance 201, i.e. Z1=Ztrx. Due to the fact that impedances of circuit components in the impedance matching circuit 210 are imaginary, if non-idealities of the components are neglected, this selection of capacitors leads also to situation in which an impedance 213 seen between a node 211 and the signal ground towards the impedance matching circuit 210 is a complex conjugate of the impedance 207, i.e. Z2=Ra−jXa. Therefore, there is an impedance matching in both directions. In more general terms, the impedance matching between two interconnected electrical systems is expressed by a requirement that the impedance towards a first electrical system has to be a complex conjugate of the impedance towards a second electrical system. In practical systems the impedances do not need to be, and in a general case they cannot be, exact complex conjugates respect to each other, but it is sufficient that an impedance mismatch between the electrical systems is below an acceptable limit. In the continuation of this document the requirement of substantially mutual conjugate impedances is called "an impedance matching condition".

Determination of component values of a tuneable impedance matching circuit requires knowledge of a real part and an imaginary part of an impedance of a circuitry that is behind the impedance matching circuit, e.g. impedance Za 207 in FIG. 2. In the continuation of this document impedance 207 is called "a load impedance". In references Szczypka Z ("A method of complex reflection coefficient estimation based on multi-probe discretization of standing wave pattern", Prace Przemyslowego Instytutu Telekomunikacji, suppl. (1988), no. 9, 151-153, Poland) and Popov M, Sailing He ("Design of an automatic impedance matching device", Microwave & Optical Technology Letters (1999), vol. 20, 236-240) a method based on sectioned transmission lines has been proposed for measuring the load impedance. This technique estimates the load impedance by measuring the voltages at multiple points of a transmission line. An arrangement in which a measurement circuit is based on a transmission line is shown in FIG. 3. A wave impedance of a transmission line has a same value as a source impedance 301. If we assume that an effect of a voltage source 308 is negligible compared to effect of a voltage source 302, a ratio of voltages V1 and V1 for any two points z1 and z2 in the transmission line is:

$$\frac{V1}{V2} = \frac{e^{-j\beta z1} + \rho e^{j\beta z1}}{e^{-j\beta z2} + \rho e^{j\beta z2}}, \quad (3)$$

where β is a propagation constant of the transmission line and ρ is a complex valued reflection coefficient. The voltages V1 and V2 are measured on the transmission line on locations 313 and 314 as shown in FIG. 3. The real and imaginary parts of the reflection coefficient can be solved from equation (3), if both amplitudes and phases of the voltages V1 and V2 are measured. Another alternative is to measure at least three voltage values to obtain more than one voltage ratio e.g. as in the reference Popov M & Sailing He. In this case, the complex value load impedance can be calculated based on only the amplitudes of the measured voltages and, therefore, no phase information is needed.

An impedance 312 that is seen from an end of the transmission line towards an impedance matching circuit 310 is $$Z1 = Z0 \frac{1+\rho}{1-\rho}, \quad (4)$$

where Z0 is the wave impedance of the transmission line. If the impedance matching circuit 310 is bypassed the impedance 312 has a same value as a load impedance 307, i.e. Z1=Za, that is needed for determining values for adjustable capacitors 303 and 304. If the impedance matching circuit is not bypassed, the value Za of the load impedance 307 can be calculated from the measured impedance value Z1 and from values of the components of the impedance matching circuit 310.

The voltage measurement points z1 and z2 must be so distant from each other that the reflection coefficient can be obtained with reasonable accuracy. This means that the length of the transmission line should be at least about the distance between a voltage maximum and a voltage minimum in a standing wave pattern, i.e. one fourth of the wavelength (λ/4). If we assume the matching frequency to be 900 MHz and the propagation speed to be two thirds of the speed of light, the length of the transmission line should be about 6 cm. For example, for a small size mobile communication device it is a very challenging task to realize a 6 cm transmission line having desired properties. Furthermore, a transmission line means electrical losses and as the transmission line carries radio frequency signals it is difficult to prevent it from radiating electromagnetic energy to surrounding space.

BRIEF DESCRIPTION OF THE INVENTION

It is an objective of the present invention to provide a tuneable impedance matching system in which the limitations and drawbacks associated with prior art are eliminated or reduced. It is also an object of the present invention to provide a mobile communication device having a tuneable impedance matching system in which the limitations and drawbacks associated with prior art are eliminated or reduced. It is also an object of the present invention to provide a tuneable impedance matching module that can be used e.g. in a mobile communication device so that the limitations and drawbacks associated with prior art are eliminated or reduced. It is also an object of the present invention to provide a method for tuning a tuneable impedance matching circuit coupled between a source and a load so that the limitations and drawbacks associated with prior art are eliminated or reduced.

The objectives of the invention are achieved with a solution in which a tuneable impedance matching circuit is used also as a measuring circuit. A value of a complex load impedance is calculated based on voltages measured on nodes of the tuneable impedance matching circuit and on known component values of the tuneable impedance matching circuit.

The invention yields appreciable benefits compared to prior art solutions:
  there is no need for a separate measuring circuit, which reduces power losses, complexity and physical size of a system and makes a construction more cost effective,
  the invented solution allows avoiding realization challenges of the kind described above associated with a transmission line,
  the invented solution allows a reduction of the electromagnetic energy that is radiated from a tuneable impedance matching system to surrounding space that may otherwise disturb other electrical components, because there is no need for transmission line.

A tuneable impedance matching system according to the invention is characterized in that it comprises:
  a tuneable impedance matching circuit coupled between a source and a load,
  voltage sensors for measuring magnitudes of voltages from at least three nodes of the tuneable impedance matching circuit, and
  calculation means for solving an impedance of the load based at least partly on the measured voltages, and for determining values for adjustable electrical components of the tuneable impedance matching circuit based at least partly on the impedance of the load and on an impedance matching condition.

A mobile communication device according to the invention is characterized in that it comprises:
  a tuneable impedance matching system having a tuneable impedance matching circuit coupled between a transmitter/receiver front-end and an antenna, voltage sensors for measuring magnitudes of voltages from at least three nodes of the tuneable impedance matching circuit, and calculation means for solving an impedance of the antenna based at least partly on the measured voltages, and for determining values for adjustable electrical components of the tuneable impedance matching circuit based at least partly on the impedance of the antenna and on an impedance matching condition.

A method for tuning a tuneable impedance matching circuit coupled between a source and a load according to the invention is characterized in that it comprises:

measuring magnitudes of voltages from at least three nodes of the tuneable impedance matching circuit, solving an impedance of the load based at least partly on the measured voltages, and determining values for adjustable electrical components of the tuneable impedance matching circuit based at least partly on the impedance of the load and on an impedance matching condition.

A tuneable impedance matching module according to the invention is characterized in that it comprises:

an electrical signal input interface and an electrical signal output interface, a tuneable impedance matching circuit coupled between the electrical signal input interface and the electrical signal output interface, a measuring interface for providing an access to the magnitude of voltage values of at least three nodes of the tuneable impedance matching circuit, and a configuration interface for providing an access for adjusting values of adjustable electrical components of the tuneable impedance matching circuit to values determined based at least partly on an impedance matching condition and on the impedance of a load coupled to the electrical signal output interface.

Features of various advantageous embodiments of the invention are disclosed below.

The exemplary embodiments of the invention presented in this document are not-to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in a sense of examples and with reference to the accompanying drawings, in which.

DETAILED DESCRIPTION OF THE PREFERRED EMBODIMENTS OF THE INVENTION

Figure 1:
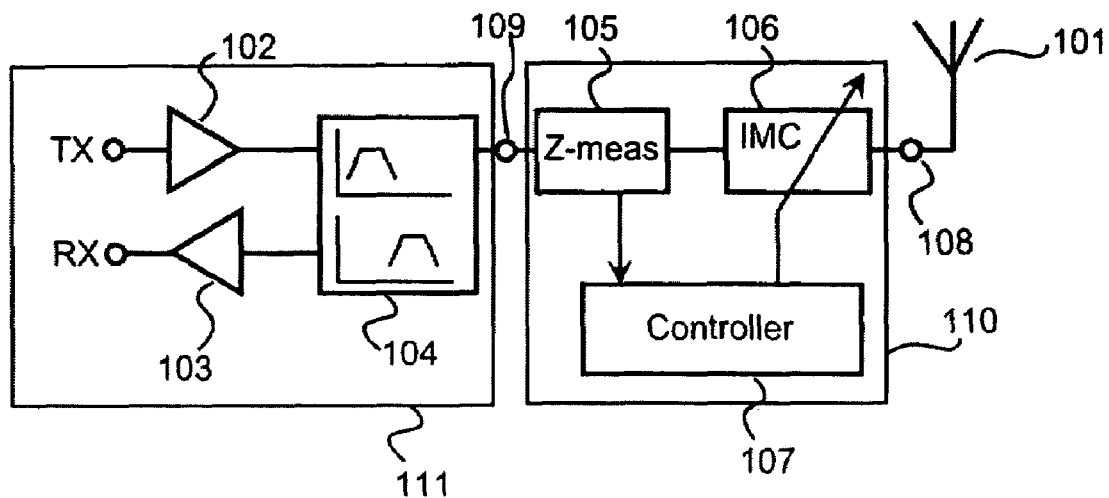
FIG. 1 shows a tuneable impedance matching system according to prior art in an exemplary application environment.
Figure 2:
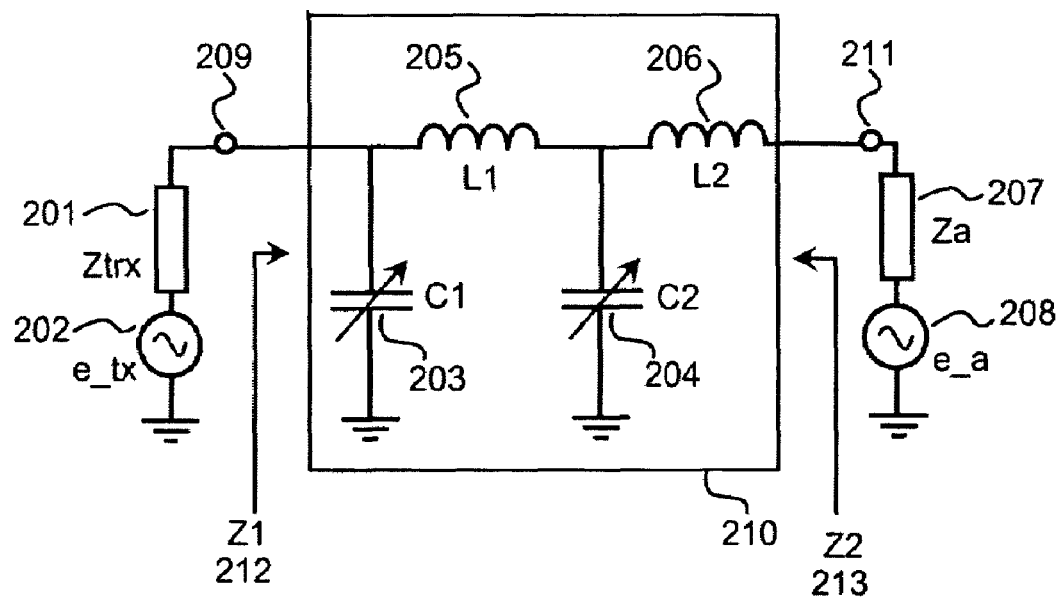
FIG. 2 shows a tuneable impedance matching circuit having a cascaded L-topology.
Figure 3:
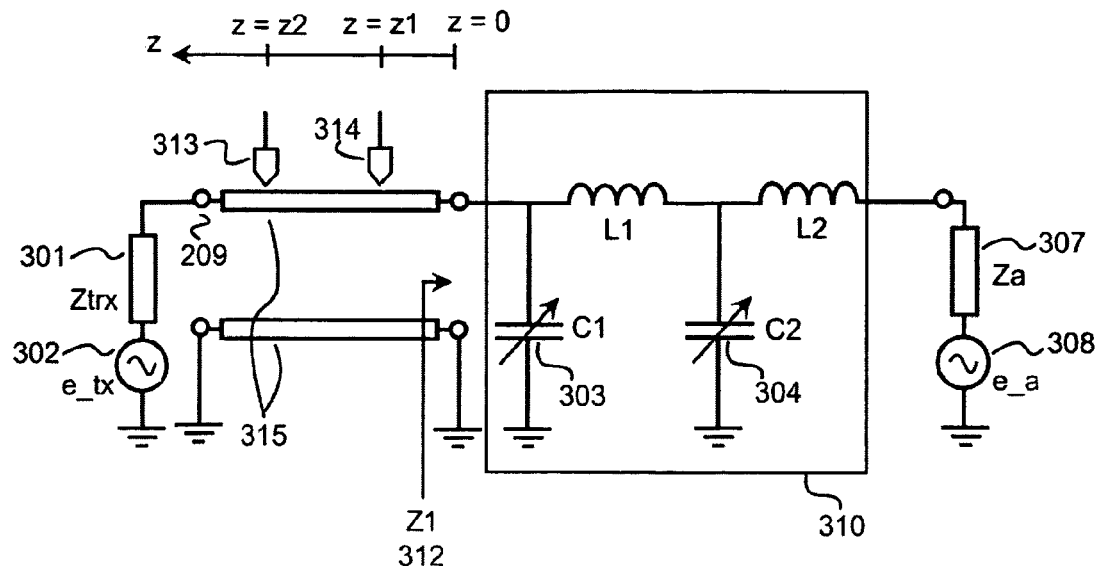
FIG. 3 shows a tuneable impedance matching system having a transmission line measuring circuit according to prior art.

FIGS. 1-3 have been explained above in the description of the prior art.

Figure 4:
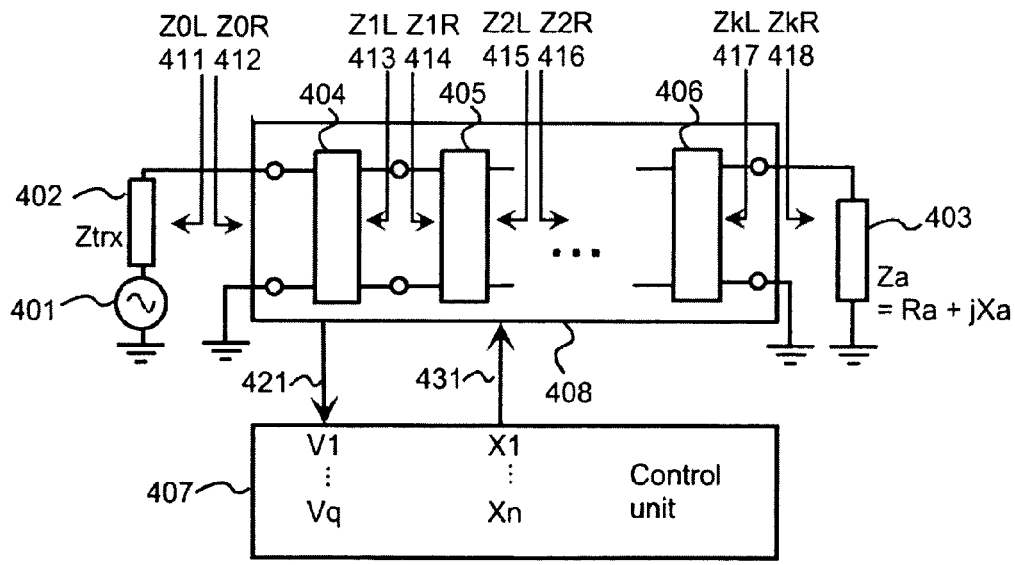
FIG. 4 shows a principle of a tuneable impedance matching system according to certain embodiments of the invention.

FIG. 4 shows a principle of a tuneable impedance matching system according to certain embodiments of the invention. The system is assumed to be energized only by a source voltage 401. The frequency at which the system is operating is assumed to be within a so narrow an interval that the system can be analyzed as if the operating frequency were constant. If there is also an electromotive force associated with a load impedance 403, the electromotive force at the load is assumed to be negligible compared with the source voltage 401. An impedance matching circuit 408 is presented as a chain of one or more four-pole circuits 404, 405, ..., 406. A control unit 407 measures a set of voltages 421 from the impedance matching circuit 408. The control unit 407 comprises calculation means for solving a real part and an imaginary part of the load impedance 403 based on the set of measured voltages 421 and based on component values of electrical circuit components within the impedance matching circuit 408. Based on the obtained load impedance 403 and on values of fixed components in the impedance matching circuit the calculation means determine the values 431 for adjustable components in the impedance matching circuit in order to perform impedance matching.

At least two voltages have to be measured, since we assume that we do not have a priori information about the source voltage 401. During a measurement phase the adjustable components of the impedance matching circuit 408 have certain pre-determined values. With certain circuit topologies for the impedance matching circuit 408 it is also possible to switch-off the adjustable components during the measurement phase. An equation that binds the measured voltages together with the real part and the imaginary part of the load impedance can be written in a general form as:

$$\underline{V1}/\underline{V2} = \underline{F}(Ra, Xa), \quad (5)$$

where complex valued quantities are underlined. V1 is a phasor (magnitude and angle) of a first measured voltage and V2 is a phasor of a second measured voltage. F is a mathematical expression whose form depends on a topology and component values of the impedance matching circuit 408, on the operating frequency, and on locations wherefrom the voltages are measured. The mathematical expression F can be derived with a standard circuit analysis procedure. Ra is the real part of the load impedance 403, and Xa is the imaginary part of the load impedance. In equation (5) we have two unknown variables, Ra and Xa, and two independent equations. Equation (5) can be rewritten in the form:

$$Re\{\underline{V1}/\underline{V2}\} = Re\{\underline{F}(Ra, Xa)\} \text{ and } Im\{\underline{V1}/\underline{V2}\} = Im\{\underline{F}(Ra, Xa)\}, \quad (6)$$

where notations Re{ } and Im{ } mean a real part and an imaginary part of a complex quantity in brackets, respectively. For the voltage ratio:

$Re\{V1/V2\}=abs\{V1\}/abs\{V2\}\times\cos(\Psi)$ and $Im\{V1/V2\}=abs\{V1\}/abs\{V2\}\times\sin(\Psi)$, (7)

where abs{V1} and abs {V2} are magnitudes of the measured voltages and $\Psi$ is a mutual phase difference of the voltages. A magnitude can be represented by e.g. an effective value like a root mean square. A drawback of using equations (6) and (7) is the fact that both the amplitudes and the mutual phase difference of the voltages have to be measured. According to an embodiment of the invention a need for measuring a phase difference of two voltages is avoided by measuring at least three voltage values so that two independent equations can be formed like:

$abs\{V1\}/abs\{V2\}=abs\{F1(Ra, Xa)\}$ and $abs\{V3\}/abs\{V2\}=abs\{F2(Ra, Xa)\}$, (8)

where abs{ } means an absolute value of a complex quantity in brackets. F1 and F2 are mathematical expressions like F in equation (5) and they differ from each other due to different locations wherefrom the respective voltages are measured. Equations (8) represent two unknown variables and two independent equations. The third equation $abs\{V1\}$ /abs$\{V3\}=abs\{F3(Ra, Xa)\}$ is not independent of the equations (8). With certain topologies of impedance matching circuit 408 the real and the imaginary part of the load impedance 403, Ra and Xa, can be solved from equations (8) in a closed form.

According to an embodiment of the invention an effect of uncertainty associated with voltage measurements and component values of the impedance matching circuit is mitigated by measuring more than three voltages, forming more than two voltage ratios, and minimizing a vector norm of a vector of circuit equation errors with respect to unknown variables Ra and Xa. For example, the vector norm of an error vector can be formulated as follows:

$$\left\| \begin{array}{c} abs\{Vn\}/abs\{Vm\} - abs\{F1(Ra, Xa)\} \\ abs\{Vi\}/abs\{Vj\} - abs\{F2(Ra, Xa)\} \\ \ldots \\ abs\{Vp\}/abs\{Vq\} - abs\{Fn(Ra, Xa)\} \end{array} \right\|$$ (9)

where abs{Vi}, . . . , abs{Vj}, . . . , abs{Vn}, . . . abs{Vm}, . . . , abs{Vp }, . . . abs{Vq},. . . are measured voltage magnitudes, e.g. effective values. F1, F2, . . . , Fn are mathematical expressions like F in equation (5) and they differ from each other due to different locations wherefrom the respective voltages are measured. This approach leads to a standard minimization task of a vector norm which can be performed e.g. with a gradient method.

According to an embodiment of the invention a phase difference of two voltages is obtained with the following procedure:

three nodes are selected from the impedance matching circuit, say nodes 1, 2 and 3, magnitudes of three voltages between the selected nodes are measured, say abs{12}, abs{V23}, and abs{V13}, due to the fact that the voltage phasors V12, V23 and V13 form a triangle the edge lengths of which are abs{V12}, abs{V23}, and abs{13}, a cosine theorem is used for solving desired phase differences, e.g.

$(abs\{V12\})^2+(abs\{V13\})^2-2(abs\{V12\})(abs\{V13\})$
$\cos(\Psi)=(abs\{V13\})^2$, (10)

where $\Psi$ is a phase difference between the phasors V12 and V13.

Many times there is no need to obtain a phase difference angle $\Psi$, but $\cos(\Psi)$ and $\sin(\Psi)$ are the quantities that are needed. In the following part of this document this method for obtaining phase difference information ($\Psi$, $\cos(\Psi)$ and/or $\sin(\Psi)$) is called "a cosine theorem method".

After obtaining estimates for the real part and the imaginary part, Ra and Xa, of the load impedance the next step is to determine values for adjustable components in the impedance matching circuit 408. The determination is based on an impedance matching condition according to which impedances towards opposite directions at a two-pole boundary are complex conjugates with respect to each other. In this document a two-pole boundary means a boundary between two electrical sub-systems in which the sub-systems are interconnected via two nodes. An example of a two-pole boundary is the electrical connection between four-pole circuits 404 and 405. For a system shown in FIG. 4 the impedance matching condition can be written, for example, as Z0L=Z0R*, where Z0L is an impedance 411 seen towards source and Z0R is an impedance 412 seen towards the load at the boundary between the source and the impedance matching circuit 408. Asterisk '*' means complex conjugation. If the electrical components of the impedance matching circuit 408 are assumed to be purely reactive and the impedance matching condition is satisfied between the impedances 411 and 412, the impedance matching condition is satisfied also between impedances 413 and 414, between impedances 415 and 416, and between impedances 417 and 418, i.e. Z1L=Z1R*, Z2L=Z2R*, and ZkL=ZkR*.

An impedance matching condition represents two independent equations, e.g.

$Z0L =Z0R* \Leftrightarrow Re\{Z0L\}=Re\{Z0R\}$ and $Im\{Z0L\}=-Im\{Z0R\}$. (11)

Impedances 412, 413, 414, 415, 416, and 417 are functions of reactance values of adjustable components in the impedance matching circuit. The impedance 411 is the source impedance 402 and the impedance 418 is the load impedance 418.

In an embodiment of the invention there are two adjustable components in the impedance matching circuit 408. The impedance matching condition is used for determining the reactance values for the two adjustable components as:

$Re\{Z0R(X1, X2)\}=Ztrx$ and $Im\{Z0R(X1, X2)\}=0$, (12)

where Z0R(X1, X2) is the impedance 412 as a function of the reactance values X1 and X2 of the two adjustable components and Ztrx is the source impedance 402 that is assumed to be purely resistive (i.e. real valued). With certain topologies of the impedance matching circuit 408 the reactance values X1 and X2 can be solved from equations (12) in a closed form.

In an embodiment of the invention more than two adjustable components are used in order to get more freedom in selection of reactance values of adjustable components. Because of the fact that the reactance values are not solely determined by the impedance matching condition, the reactance values can be chosen such that realization aspects are taken into account better.

Due to non-idealities, e.g. a non-zero series resistance, in the fixed and adjustable components of the impedance matching circuit the impedance matching condition is not necessary satisfied in all two-pole boundaries simultaneously. Referring to FIG. 4 it may be that e.g. when the impedance matching condition is satisfied between impedances 413 and 414 it is not satisfied between impedances 415 and 416, i.e.

$$Z1L = Z1R^* \text{ but } Z2L \neq Z2R^*, \quad (13)$$

where Z1L, Z1R, Z2L, and Z2R are the impedances 413, 414, 415, and 416, respectively. In an embodiment of the invention the reactance values of the adjustable components are determined so that simultaneous satisfaction of the impedance matching condition in more than one two-pole boundary is optimized. This can be accomplished by e.g. minimizing a vector norm of a vector of impedance matching errors in different two-pole boundaries with respect to values associated with the adjustable components, e.g. with respect to reactance values X1, ..., Xn:

$$\left\| \begin{array}{c} \text{abs}\{Z1L(X1, \ldots, Xn) - Z1R(X1, \ldots, Xn)^*\} \\ \text{abs}\{Z2L(X1, \ldots, Xn) - Z2R(X1, \ldots, Xn)^*\} \\ \ldots \\ \text{abs}\{ZmL(X1, \ldots, Xn) - ZmR(X1, \ldots, Xn)^*\} \end{array} \right\|, \quad (14)$$

where an i:th (i=1, ..., m) vector element abs{ZiL(X1, ..., Xn) −ZiR(X1, ..., Xn)} constitutes an absolute value of an error in the impedance matching condition at an i:th two-pole boundary.

The obtained reactance values correspond to certain inductance or capacitance values depending on the type of the corresponding adjustable component. For example, a reactance of an inductor is 2πf×inductance (X=2πfL), where f is a frequency at which the impedance matching takes place. It is also possible to realize a purely imaginary impedance with a section of a transfer line. Corresponding component values, e.g. capacitances and/or inductances, are calculated based on reactance values obtained with some of the methods described above. The control unit 407 tunes the adjustable components of the impedance matching circuit 408 to correspond as well as possible with the calculated component values.

In an embodiment of the invention the control unit comprises control means for performing a process 'solve load impedance—determine values for adjustable components—tune the adjustable components' periodically at a desired pace. An electromotive force associated with the load (as reference 308 in FIG. 3) causes error in the calculation of the load impedance. In many applications the effect of the electromotive force associated with the load is, however, so small compared with an effect of an electromotive force of the source that the error is tolerable. An example of this kind of application is a mobile communication device.

The voltage magnitude measurements can be implemented by using a high input impedance logarithmic radio frequency power detector (e.g. LT5534 or AD8313 that have more than 60 dB dynamic range) followed by an analog-to-digital converter.

The control unit 407 can be realized with a programmable processor plus a software product stored on a computer readable medium for execution by the processor, the software product comprising software means for performing the above-described mathematical operations. As another option the control unit can be realized with one or more dedicated circuits that is/are designed to perform the above-mentioned operations. In this case electrical connections between logic ports and other elements of a circuit form the intelligence that controls the operations. A dedicated circuit can be e.g. an application specific integrated circuit (ASIC). The control unit can also be realized with one or more field programmable gate array (FPGA) components. A FPGA component is configured before its operation with configuration software to emulate a dedicated circuit. Furthermore, the control unit can be a hybrid construction comprising at least two from the following list: a programmable processor plus a corresponding software product, a dedicated circuit, a field programmable gate array component plus appropriate configuration software.

There are a lot of different circuit topologies that can be used for the impedance matching circuit 408. Desired properties of a circuit topology for an impedance matching circuit are simplicity, the fact that required mathematics is not excessively complex, and the fact that component values are realizable in practice. Two different impedance matching circuit topologies are presented below and with the aid of FIGS. 5-7.

Figure 5:
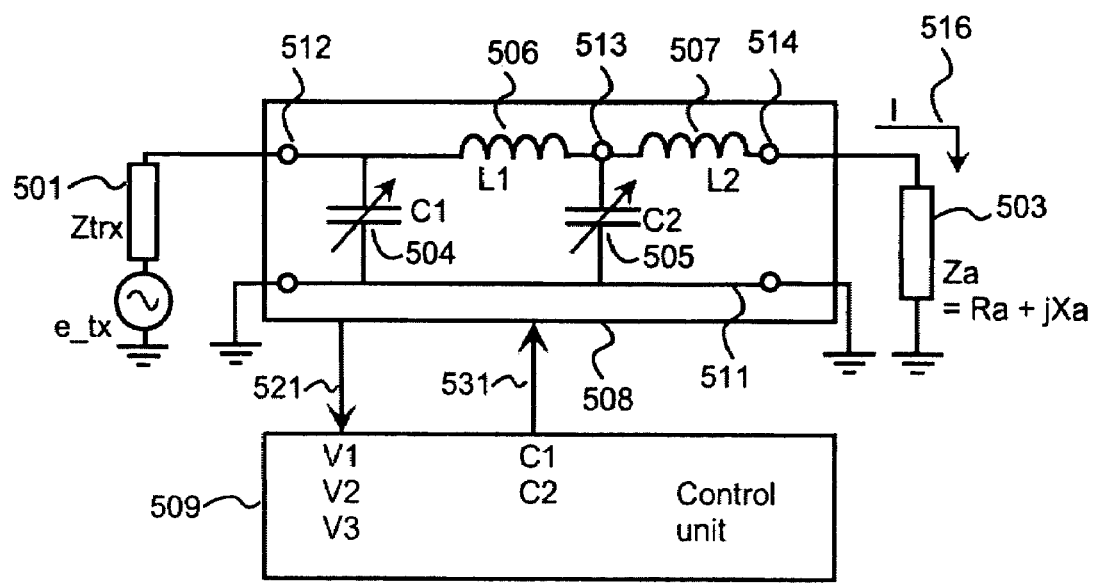
FIG. 5 shows a tuneable impedance matching system according to an embodiment of the invention.

FIG. 5 shows a tuneable impedance matching system according to an embodiment of the invention. In this embodiment there is a cascaded L-topology impedance matching circuit 508. In the impedance matching circuit there are two fixed value inductor 506 and 507 having inductances L1 and L2 and two adjustable capacitors 504 and 505. Two alternative exemplary ways to obtain a value of a complex load impedance 503 are presented below.

In the first alternative magnitudes, e.g. effective values, of the following voltages are measured:

V1=magnitude of voltage between a node 514 and a signal ground 511,

V2=magnitude of voltage between a node 513 and the signal ground 511, and

V3=magnitude of voltage between a node 512 and the signal ground 511.

During the measurement the adjustable capacitors 504 and 505 have certain pre-determined values C1 and C2 or they are switched-off. A real part Ra and an imaginary part Xa of the load impedance 503 can be calculated as presented in the following equations.

Denote V1/V2=m1 and V1/V3=m2, calculate the following auxiliary variables H1 H2, H3, and H as $$H1 = -m2^2(\omega^4 C2^2 L2^2 - 2\omega^2 C2L2 + m1^2 + 1)L1^2, \quad (15)$$

$$H2 = 2L1\,L2\,m2^2(\omega^2 C2\,L2 - 1) - L2^2 m2^2 + L2^2 m1^2,$$

$$H3 = L1\,m1\,m2^2(\omega^2 C2\,L1\,L2 - L1 - L2),$$

$$H = (H1 + H2)/(2\,H3),$$

$$Ra = \frac{m1 L2\omega \sqrt{1-H^2}}{m1^2 H^2 - 2m1H + m1^2(1-H^2) + 1}, \quad (16)$$

$$Xa = \frac{-m1 L2\omega(m1-H)}{m1^2 H^2 - 2m1H + m1^2(1-H^2) + 1}, \quad (17)$$

where ω is 2π×frequency at which the impedance matching is performed. If the adjustable capacitors 504 and 505 are switched-off, values C1=C2=0 are inserted in equations (15). If the capacitors are switched-off, there are actually series connections of the capacitors and parasitic capacitances of switch elements; switch elements are not shown in FIG. 5.

In the second alternative the cosine theorem method is used for solving a value of the complex load impedance 503. Magnitudes, e.g. effective values, of the following voltages are measured:

V1=magnitude of voltage v1 between the node 514 and the signal ground 511,

V2=magnitude of voltage v2 between the node 513 and the signal ground 511, and

V3=magnitude of voltage v3 between the nodes 513 and 514.

Figure 6:
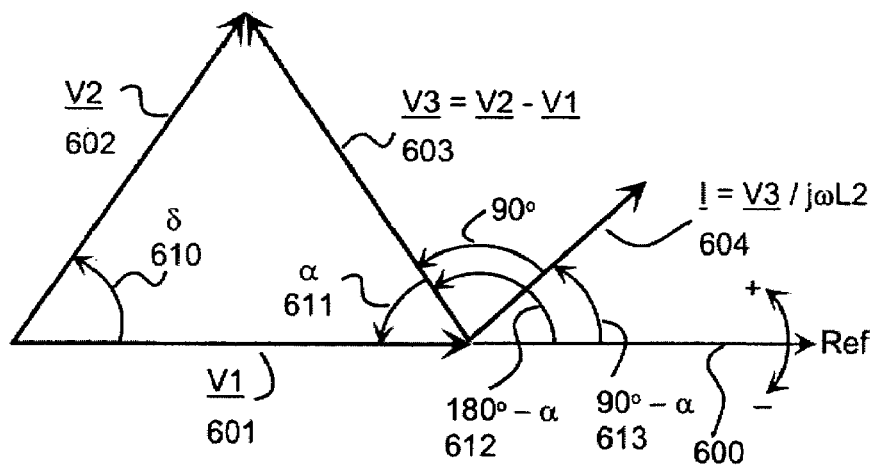
FIG. 6 shows a phasor diagram used for obtaining a value of a complex load impedance in an embodiment of the invention.

A phasor diagram for said voltages is shown in FIG. 6. In the phasor diagram a voltage phasor 601 of the voltage v1 is aligned with a reference axis 600, i.e. an angle of the voltage phasor 601 is zero. We assume that electrical energy flows towards the load impedance 503. Based on this assumption we can conclude that the voltage v2 is leading the voltage v1, i.e. an angle δ 610 belongs to a range $0 \leq \delta \leq 180°$ as in FIG. 6. Cosine of angle α 611, cos(α), can be solved with the cosine theorem. The angle α belongs to range $0 \leq \alpha \leq 180°$, because the angle δ 610 belongs to a range $0 \leq \delta \leq 180°$. Therefore, $\sin(\alpha) \geq 0$ and thus $\sin(\alpha) = +(1-\cos^2(\alpha))^{1/2}$. A current phasor I 604 of current 516 through the inductor 507 can be calculated as l=V3 /jωL2, where V3 is a voltage phasor 603 of the voltage v3. It can be seen from FIG. 6 that an angle 613 of the current phasor 604 is 90°-α.

An absolute value of the load impedance 503 is $$abs\{Za\}=V1/(V3/\omega L2), \quad (18)$$

where ω is an operating frequency. The real and the imaginary parts of the load impedance are $$Ra=abs\{Za\}\cos(\alpha-90°)=abs\{Za\}\sin(\alpha), \quad (19)$$

$$Xa=abs\{Za\}\sin(\alpha-90°)=-abs\{Za\}\cos(\alpha). \quad (20)$$

The real part is non-negative (Ra≥0) as an be concluded form the above-presented reasoning ($0 \leq \alpha \leq 180°$) and from the fact that abs{Za}>0. This result is in line with the assumption that electrical energy flows towards the load impedance 503. Values of sin(α) can be, for example, tabulated as a function of values of cos(αa).

A third alternative for obtaining the real and imaginary parts of the load impedance would be to measure only the voltage v3 between the nodes 513 and 514 and the voltage v1 between the node 514 and the signal ground 511 and to use a phase detector to obtain the phase difference between the voltages v1 and v3. Equations (18), (19), and (20) can be used as described above.

After the real and the imaginary parts of the load impedance 503 have been obtained the values of the adjustable capacitors 504 and 505 that lead to impedance matching can be solved from equations (1) and (2). Equations (1) and (2) were presented in this document within the description of prior art. With equations (1) and (2) we assumed that a source impedance 501 is real valued. A control unit 509 receives the measured voltage magnitudes 521, performs the mathematical operations of the kind described above, and tunes 531 the adjustable capacitors 504 and 505 to correspond as well as possible with the calculated capacitance values.

The adjustable capacitors 504 and 505 can be continuously variable (varicaps) capacitors, switched capacitors (using for example FETs for switching), or combinations of continuously variable capacitors and switched capacitors.

Figure 7:
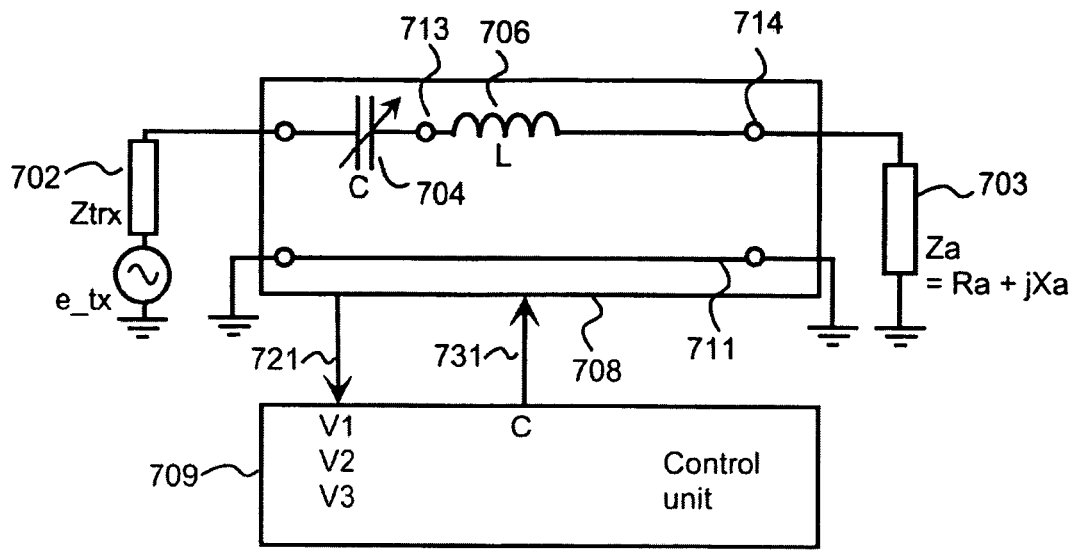
FIG. 7 shows a tuneable impedance matching system according to an embodiment of the invention.

FIG. 7 shows a tuneable impedance matching system according to an embodiment of the invention. In this embodiment there is a serial-LC impedance matching circuit 708. In the impedance matching circuit there is a fixed value inductor 706 having inductance L and an adjustable capacitor 704. The impedance matching circuit is able to perform full impedance matching only when a real part of a load impedance 703 equals a real part of a source impedance 702, i.e Ra=Re{Ztrx}. Otherwise, only partial impedance matching can be performed.

The real and the imaginary parts of the load impedance can be obtained, for example, by using the cosine theorem method with a similar procedure as described above and with the aid of FIGS. 5 and 6. For this, magnitudes of three voltages v1, v2 and v3 are measured, where v1 is voltage between a node 714 and a signal ground 711, v2 is voltage between a node 713 and the signal ground, and v3 is a voltage between the nodes 713 and 714.

A capacitance of the adjustable capacitor 704 for performing (partial) impedance matching (as well as possible) is $$C = \frac{1}{\omega(Xa + \text{Im}\{Ztrx\} + \omega L)}, \quad (21)$$

where ω is 2π×frequency at which the (partial) impedance matching is performed, Xa is an imaginary part of the load impedance 703, Im{Zrx} is an imaginary part of the source impedance 702, and L is the inductance of the fixed inductor 706. With a proper choice of the inductance L a risk that equation (21) produces a negative capacitance value can be eliminated.

A control unit 709 receives the measured voltage magnitudes 721, performs the mathematical operations of the kind described above, and tunes 731 the adjustable capacitor 704 to correspond as well as possible with the calculated capacitance value.

Figure 8:
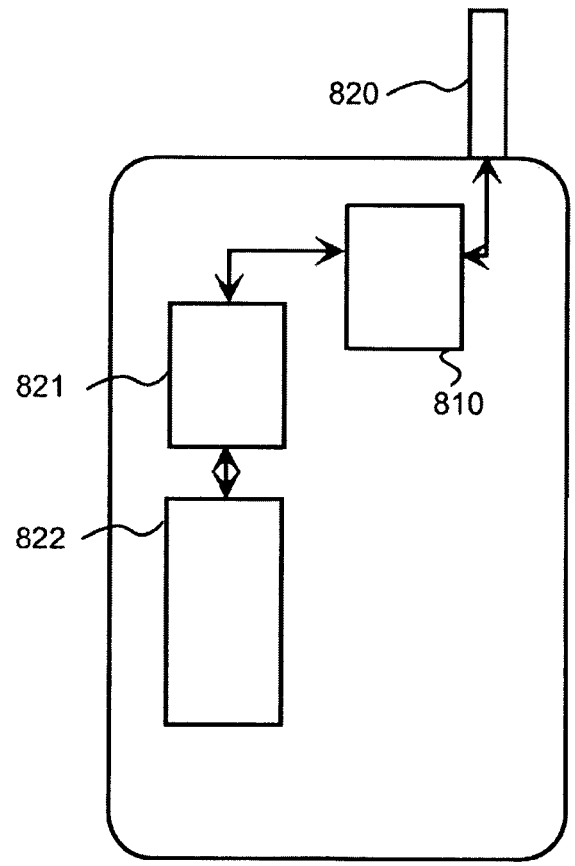
FIG. 8 shows a mobile communication device according to an embodiment of the invention.

FIG. 8 shows a mobile communication device according to an embodiment of the invention. The mobile communication device comprises an impedance matching system 810 according to any of the embodiments described above and with the aid of FIGS. 4-7. The impedance matching system 810 performs impedance matching between an antenna 820 and a receiver/transmitter front-end 821. The front-end is assumed to include possible duplexer filters. A block 822 represents all the parts of the mobile communication device that provides a signal to be transmitted for a transmitter part of the front-end 821 and receives signal from a receiver part of the frontend. The block 822 comprises e.g. a modulator, a demodulator, equalizers, filtering systems, controllers, a microphone, a speaker, etc. The mobile communication device can be e.g. a mobile phone.

Figure 9:
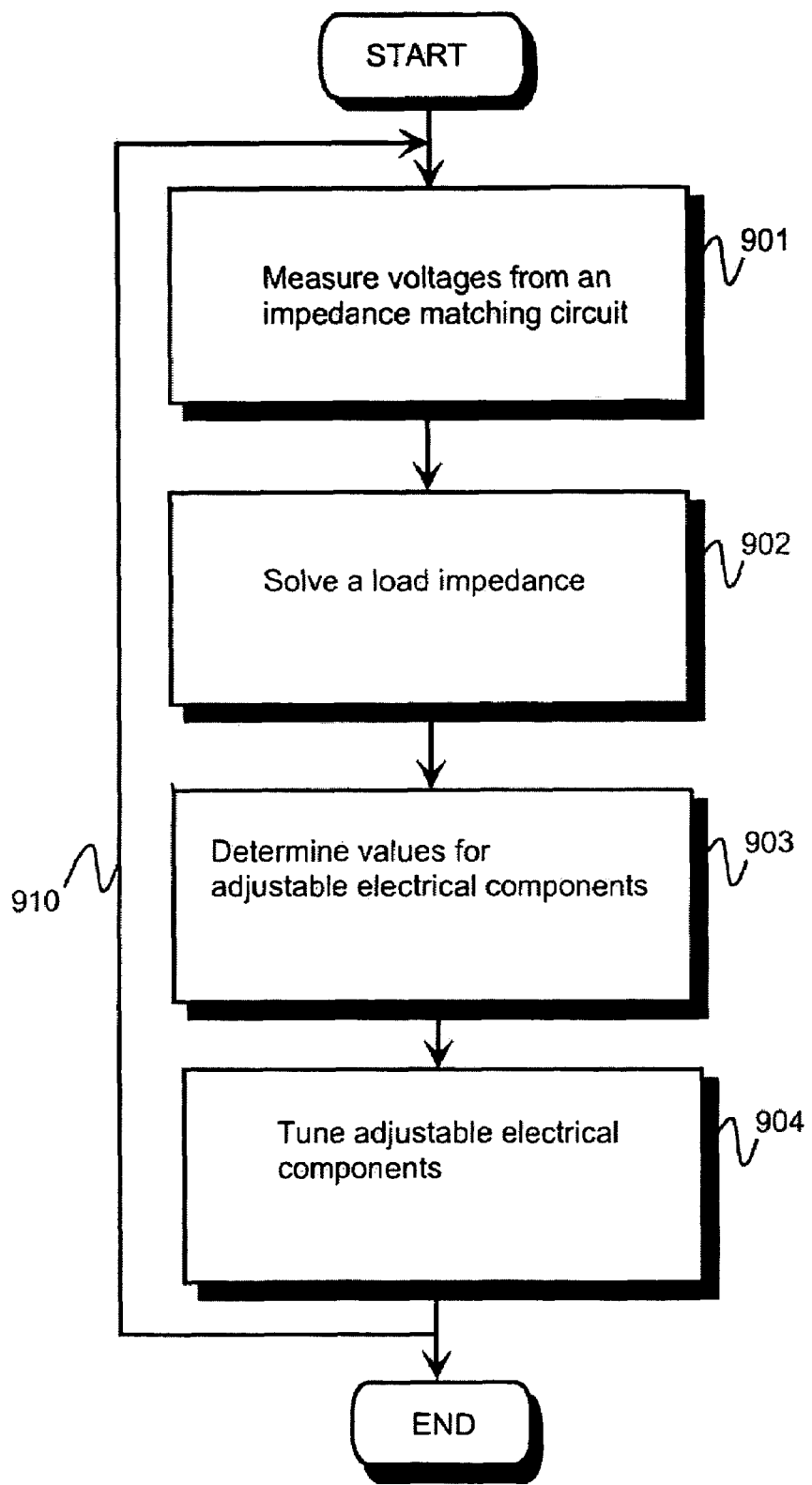
FIG. 9 shows a flow chart for a method for tuning a tuneable impedance matching circuit between a source and a load according to an embodiment of the invention.

FIG. 9 shows a flow chart for a method for tuning a tuneable impedance matching circuit between a source and a load according to an embodiment of the invention. In phase 901 voltages from at least two nodes of the tuneable impedance matching circuit are measured. In phase 902 a real part and an imaginary part of a load impedance is calculated based at least partly on the measured voltages. In phase 903 values for adjustable electrical components of the tuneable impedance matching circuit are determined based at least partly on the impedance of the load and on an impedance matching condition. In phase 904 adjustable components of the tuneable impedance matching circuit are tuned to correspond as well as possible with the determined values. This process can be repeated 910 periodically at a desired pace in order to follow changing impedance conditions. An electromotive force associated with the load (as reference 308 in FIG. 3) causes error in the calculation of the load impedance. In many applications the effect of the electromotive force associated with the load is, however, so small compared with an effect of an electromotive force of the source that the error is tolerable. An example of this kind of application is a mobile communication device.

Figure 10:
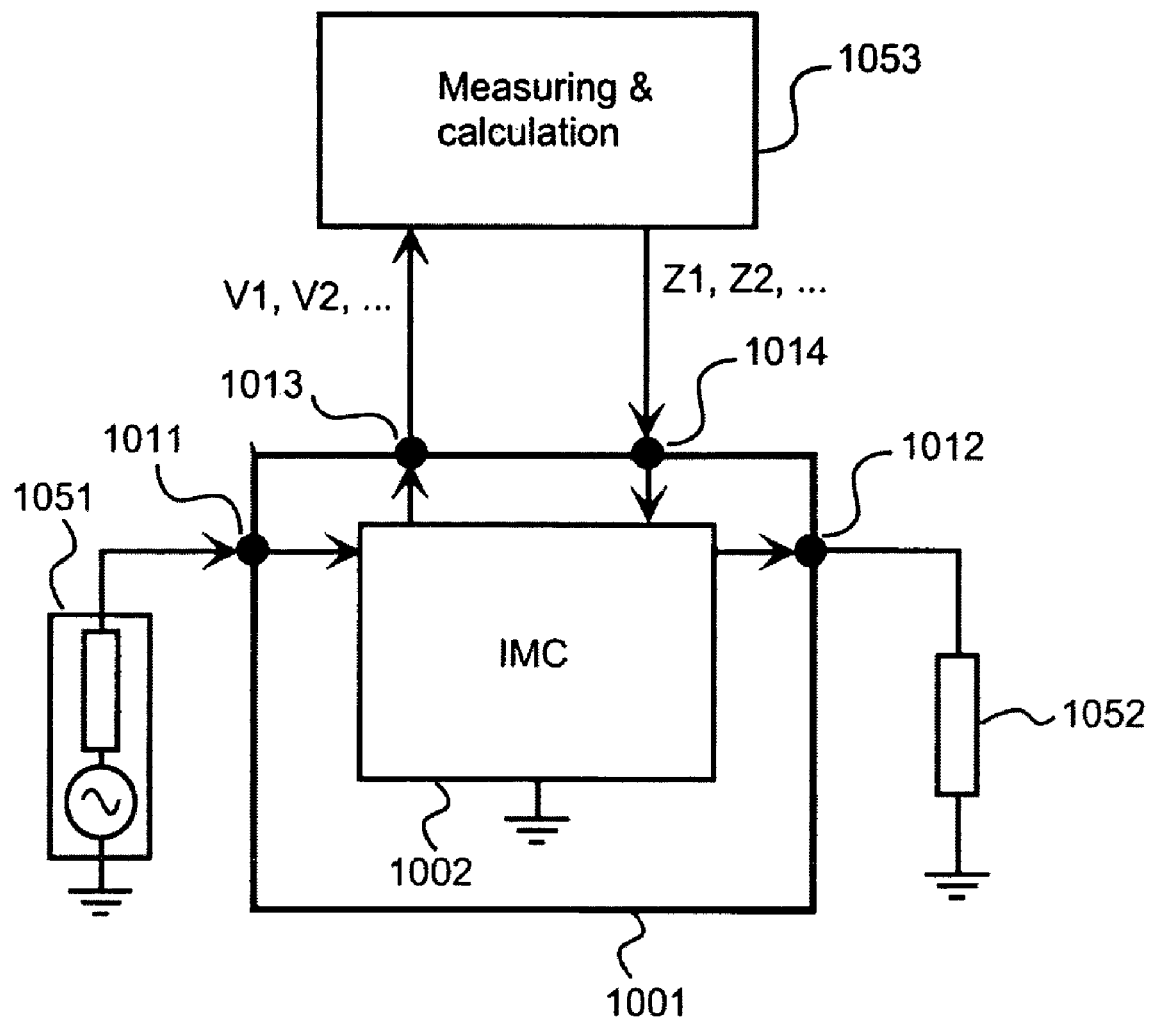
FIG. 10 shows a tuneable impedance matching module according to an embodiment of the invention.

FIG. 10 shows a tuneable impedance matching module 1001 according to an embodiment of the invention. The tuneable impedance matching module 1001 comprises an electrical signal input interface 1011, an electrical signal output interface 1012, a tuneable impedance matching circuit (IMC) 1002 coupled between the electrical signal input interface and the electrical signal output interface, a measuring interface 1013, and a configuration interface 1014.

A signal source 1051, a load 1052, and measuring and calculation means 1053 that are presented in FIG. 10 are not parts of the tuneable impedance matching module 1001 but they are presented in the figure as an exemplary operation environment. The signal source 1051 is coupled to the electrical signal input interface 1011. The load 1052 is coupled to the electrical signal output interface 1012. The measuring and calculation means 1053 are coupled to the measuring interface 1013 and to the configuration interface 1014.

The measuring interface 1013 provides for the measuring and calculation means 1053 an access to voltage values V1, V2, ... of at least two nodes of the tuneable impedance matching circuit 1002. An impedance of the load 1052 is solved by the measuring and calculation means 1053 based at least partly on the measured voltages. Values Z1, Z2, ... for adjustable electrical components of the tuneable impedance matching circuit 1002 are determined by the measuring and calculation means 1053 based at least partly on the impedance of the load 1052 and on an impedance matching condition. The configuration interface 1014 provides for the measuring and calculation means 1053 an access for adjusting the adjustable electrical components of the tuneable impedance matching 1002 circuit to the determined values Z1, Z2, ....

The tuneable impedance matching module 1001 can be a discrete physical component or it can be a sub-module of a more extensive module having also other functionalities. The tuneable impedance matching module 1001 can be integrated to be a sub-module of e.g. a power amplifier module, a front-end module, or an antenna switch module. When the tuneable impedance matching module 1001 is a sub-module of a more extensive module one or more of the above mentioned interfaces can be internal interfaces within the more extensive module, e.g. a power amplifier module. In this document an interface associated with a tuneable impedance matching module may mean either an interface on a boundary of a discrete physical component or an interface within a more extensive module having also other elements than the tuneable impedance matching module.

It will be evident to anyone of skill in the art that the invention and its embodiments are thus not limited to the above-described examples, but may vary within the scope of the independent claims.

I claim:

1. A tuneable impedance matching system, comprising:
   a tuneable impedance matching circuit coupled between a source and a load,
   voltage sensors for measuring magnitudes of voltages from at least three nodes of the tuneable impedance matching circuit, and
   calculation device for solving an impedance of the load based at least partly on the measured voltages, and for determining values for adjustable electrical components of the tuneable impedance matching circuit based at least partly on impedance of the load and on an impedance matching condition.

2. A tuneable impedance matching system according to claim 1, wherein said tuneable impedance matching circuit has a cascaded-L topology with two fixed value inductors and two adjustable capacitors.

3. A tuneable impedance matching system according to claim 1, wherein said calculation device is disposed to solve the impedance of the load with a cosine theorem method.

4. A tuneable impedance matching system according to claim 1, comprising a controller disposed to repeat periodically a process including measuring voltages from the at least three nodes of the tuneable impedance matching circuit, solving an impedance of the load based at least partly on the measured voltages, and determining values for adjustable electrical components of the tuneable impedance matching circuit based at least partly on the impedance of the load and on an impedance matching condition.

5. A tuneable impedance matching system according to claim 1, wherein the voltage sensors are disposed to measure more than three voltage magnitudes and the calculation device is disposed to form more than two voltage magnitude ratios and to minimize a vector norm of a vector of circuit equation errors with respect to a real part and an imaginary part of the impedance of the load.

6. A tuneable impedance matching system according to claim 1, wherein the calculation means are disposed to form a vector of impedance matching errors in more than one two-pole boundary and to minimize a vector norm of said vector with respect to values associated with adjustable components in the tuneable impedance matching circuit.

7. A tuneable impedance matching module, comprising:
   an electrical signal input interface and an electrical signal output interface,
   a tuneable impedance matching circuit coupled between the electrical signal input interface and the electrical signal output interface,
   a measuring interface for providing an access to magnitudes of voltages of at least three nodes of the tuneable impedance matching circuit, and
   a configuration interface for providing an access for adjusting values of adjustable electrical components of the tuneable impedance matching circuit.

8. A mobile communication device, comprising:
   a tuneable impedance matching system having a tuneable impedance matching circuit coupled between a transmitter/receiver front-end and an antenna,
   voltage sensors for measuring magnitudes of voltages from at least three nodes of the tuneable impedance matching circuit, and
   calculation device for solving an impedance of the antenna based at least partly on the measured voltages, and for determining values for adjustable electrical components of the tuneable impedance matching circuit based at least partly on the impedance of the antenna and on an impedance matching condition.

9. A mobile communication device according to claim 8, wherein the mobile communication device is a mobile phone.

10. A method for tuning a tuneable impedance matching circuit coupled between a source and a load, comprising:
    measuring magnitudes of voltages from at least three nodes of the tuneable impedance matching circuit,
    solving an impedance of the load based at least partly on the measured voltages, and
    determining values for adjustable electrical components of the tuneable impedance matching circuit based at least partly on the impedance of the load and on an impedance matching condition.

11. A method according to claim 10, comprising measuring magnitudes of voltages from three nodes of said tuneable impedance matching circuit.

12. A method according to claim 10, comprising solving the impedance of the load with a cosine theorem method.

13. A method according to claim 10, comprising repeating periodically a process including measuring voltages from at least two nodes of the tuneable impedance matching circuit, solving an impedance of the load based at least partly on the measured voltages, and determining values for adjustable electrical components of the tuneable impedance matching circuit based at least partly on the impedance of the load and on an impedance matching condition.

14. A method according to claim 10, comprising measuring more than three voltage magnitudes, forming more than two voltage magnitude ratios, and minimizing a vector norm of a vector of circuit equation errors with respect to a real part and an imaginary part of the impedance of the load.

15. A method according to claim 10, comprising forming a vector of impedance matching errors in more than one two-pole boundary and minimizing a vector norm of said vector with respect to values associated with adjustable components in the tuneable impedance matching circuit.

* * * * *

UNITED STATES PATENT AND TRADEMARK OFFICE
CERTIFICATE OF CORRECTION

PATENT NO. : 7,586,384 B2 Page 1 of 1
APPLICATION NO. : 11/204770
DATED : September 8, 2009
INVENTOR(S) : Tero Ranta It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 658 days.

Signed and Sealed this

Fourteenth Day of September, 2010

David J. Kappos
*Director of the United States Patent and Trademark Office*